United States Patent [19]

Benson

[11] Patent Number: 4,494,065
[45] Date of Patent: Jan. 15, 1985

[54] ELECTRIC CAPACITY MEASUREMENT OF ERRATICALLY SHORTED CAPACITORS

[75] Inventor: Harvey S. Benson, San Antonio, Tex.

[73] Assignee: Southwest Research Institute, San Antonio, Tex.

[21] Appl. No.: 440,007

[22] Filed: Nov. 8, 1982

[51] Int. Cl.$^3$ ............................................. G01R 27/26
[52] U.S. Cl. ............................. 324/61 R; 324/60 CD
[58] Field of Search ................. 324/61 R, 60 CD, 111

[56] References Cited

U.S. PATENT DOCUMENTS

| | | | |
|---|---|---|---|
| 4,057,754 | 11/1977 | Pattantyus | 324/61 R X |
| 4,243,933 | 1/1981 | Rollman | 324/60 CD |

FOREIGN PATENT DOCUMENTS 0122903  9/1981  Japan ................................ 324/61 R

OTHER PUBLICATIONS

Masopust: "Capacitor Fault Clearing Energy Measuring System", Western Electric Tech. Digest, 1974, pp. 39–40.

Primary Examiner—Gerard R. Strecker
Assistant Examiner—Jose M. Solis
Attorney, Agent, or Firm—Gunn, Lee & Jackson

[57] ABSTRACT

A method and apparatus for determining the average clearance between closely fitting cylindrical parts by determining electrical capacity between the bore and cylinder across a dielectric of known characteristics. The method and apparatus is useful to obtain an accurate measurement of diametral clearance between a piston and bore of a fuel injection pump. In the present invention, an electronic circuit is used to rapidly measure the capacitance magnitude during intermittent and unpredictable periods of nonshort between the piston and bore as the piston is moved inside the bore. The areas of the piston and bore are known and therefore the average clearance therebetween can be calculated.

15 Claims, 4 Drawing Figures

ELECTRIC CAPACITY MEASUREMENT OF ERRATICALLY SHORTED CAPACITORS

BACKGROUND OF THE INVENTION

This invention relates to a method and apparatus for determining the average clearance between closely fitting cylindrical parts and, more particularly, to a means for determining the electrical capacity between a piston and bore having a dielectric material therebetween, which piston and bore are randomly and unpredictably shorted.

During the manufacture of pistons and bores for devices such as diesel engine fuel injection pumps, the accurate measurement of the clearance between the cylindrical parts is critical. The accurate measurement of such clearances is difficult with fluid leak rates or pressure drop measurements being currently employed to infer clearances. Observe that because the mechanical area of the piston and bore, and the dielectric constant of a dielectric material positioned therebetween can be measured with requisite precision, the very small unknown diametral clearance between the piston and bore can then be accurately determined by measuring the electrical capacitance between the piston and bore and calculating the average spacing of the capacitor thereby realized.

While attempting said capacitance measurement, the piston and bore function as a capacitor only at random and unpredictable times because of minute roughness or imperfection in the mating surfaces that ordinarily puncture the dielectric material and cause the piston and bore to short together electrically. No devices known to applicant currently provide for the measuring of the capacity between the piston and bore during the short random and unpredictable time intervals in which they are not shorted.

Accurate measurement of the diametral clearance between the piston and bore is critical in quality assurance during manufacture of numerous products. Before assembling a device such as a diesel engine fuel injection pump, the clearances must be checked, preferably during the manufacturing process. The present invention also has application to certain types of hydraulic valves and cylinders requiring close tolerance fits as well as to firearms.

SUMMARY OF THE INVENTION

It is an object of the present invention to provide a method and apparatus for accurately measuring the difference in diameter between concentric cylindrical parts, i.e. diametral clearance.

It is another object of the present invention to provide a method and apparatus for determining the average clearance between closely fitting pistons and bores by measuring the capacity therebetween and thereafter calculating the average clearance using known values.

It is yet another object of the present invention to provide a method and apparatus for measuring the capacitance of small clearances between pistons and bores, which piston and bore act as a capacitor only at random and unpredictable times of nonshort therebetween.

It is even another object of the present invention to provide an electrical circuit whereby a piston may be moved inside a bore having a dielectric material therebetween while at the same time maintaining an electrical connection with both the piston and bore. A voltage is applied across the capacitor formed by the piston and bore through a constant current source. During periods of nonshort between the piston and bore, a charge voltage will build between the piston and bore due to the action of the applied constant current source. Integrity of charge magnitude is assured by use of a very high impedence isolation amplifier. Because the piston and bore remain unshorted only momentarily, and for random and unpredictable periods, the capacity measurement can be accomplished only during periods of nonshort longer than a predetermined time interval; for example, one hundred microseconds. Upon each occasion that the piston and bore become unshorted, the circuitry of the present invention senses the immediate rise from ground potential of the charge voltage which begins to accumulate across the capacitor now realized by the piston and bore and initiates a timing cycle of known length, typically one hundred microseconds. By use of a gate generator and an inhibit gate, the electrical charge magnitude value reached between the piston and bore at constant current input during the 100 microsecond timing cycle is stored. From the known values of constant current and charging time, a determination of system time constant may be made, and by using other known values, such as the dielectric constant and the effective area of the piston and bore, the average clearance between the piston and bore can be accurately calculated. Those periods of unshort whose duration is less than 100 microseconds are ignored by the electrical circuitry of the invention and in no way influence the time constant value indicated.

DESCRIPTION OF THE PREFERRED EMBODIMENT

To determine the capacitance between a piston and bore using the method as described hereinbelow, the piston and bore must first be cleaned and then assembled in their normal relationship with a carefully filtered lubricant therebetween to serve as a dielectric. The lubricant should have no particles in excess of 2 microns in diameter. When properly assembled, the piston and bore become the plates of a cylindrical capacitor whose electrical capacity, physical area, and dielectric properties are readily determined with accuracy. There remains only the average spacing or clearance between the capacitor's plates, namely the piston and bore, as an unknown.

Figure 1:
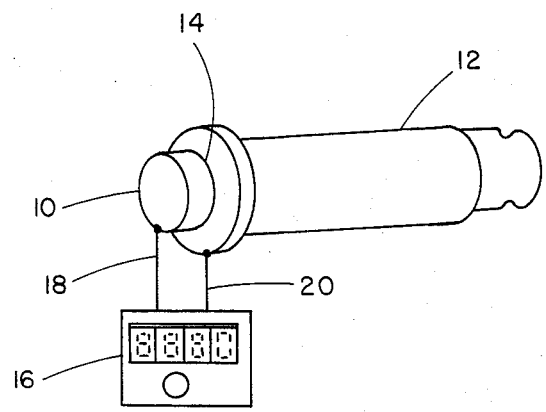
FIG. 1 is a pictorial view illustrating capacity measurement between a close fitting concentric piston and bore.

Referring to FIG. 1, there is shown a typical arrangement for measuring the average spacing or clearance between a piston 10 and a bore 12. The piston 10 is located inside of the bore 12 with a lubricant 14 having a known dielectric constant being located therebetween. The lubricant 14 insulates the piston 10 from the bore 12. By connecting a capacity measuring device 16 to the piston 10 and bore 12 via leads 18 and 20, respectively, the capacity between the piston 10 and the bore 12 may be readily measured. Upon substitution of known values into equations well-known to those skilled in the art, the average clearance between the piston 10 and bore 12 is quickly determined.

Figure 2:
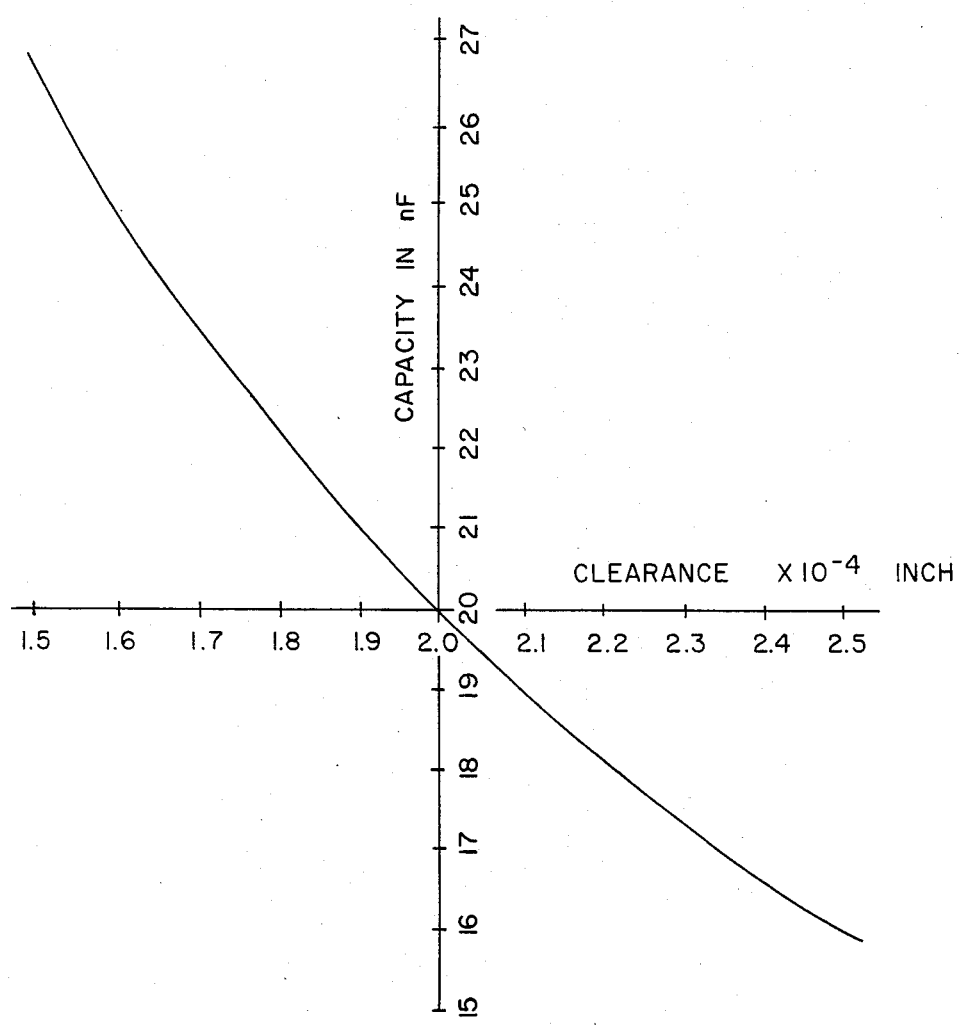
FIG. 2 is a chart of the capacity measurement versus clearance between the piston and bore illustrated in FIG. 1.

Referring to FIG. 2, the clearance versus capacity of a piston and bore as shown in FIG. 1 is illustrated graphically. For the purpose of the plot as shown in FIG. 2, the piston 10 has an outer diameter of eleven millimeters and is sixty-one millimeters in length. The bore 12 has an inner diameter of eleven millimeters plus the clearance and is also sixty-one millimeters in length. The dielectric constant of the lubricant is about three. By using these calculations, a capacity variation of approximately 1 nanoFarad ($10^{-9}$ Farads) can be expected for each ten millionths of an inch clearance change, provided that the median value for the clearance is 200 millionths of an inch (0.0002 inches). By use of the system as shown in FIGS. 1 and 2, the capacity can be easily and accurately measured with ordinary instrumentation to 1/10th of a nanoFarad ($10^{-10}$ Farads) thereby yielding an accuracy of 1 millionth of an inch clearance, far exceeding the measurement capability of other methods.

However, utilization of the principle and apparatus, as indicated hereinabove in connection with FIGS. 1 and 2, to measure small clearances between pistons and bores is not practical. Because of minute roughness between the mating surfaces of the piston 10 and bore 12, they do not act as a capacitor with the lubricant 14 therebetween on a continuous basis. There is almost continuously a short between the piston 10 and bore 12 with the piston 10 and bore 12 acting as a capacitor only at random and unpredictable times. If the piston 10 is slowly rotated, stroked or otherwise moved with respect to the bore 12, the electrical short therebetween will be momentarily removed at random intervals and capacitive action will be observed. Hereinbelow, an apparatus and method to provide rapid measurement of the transitory capacitance with a stored electrical signal proportional to that capacitance for a period of time sufficient for the capacity value to be read out is provided.

Figure 3:
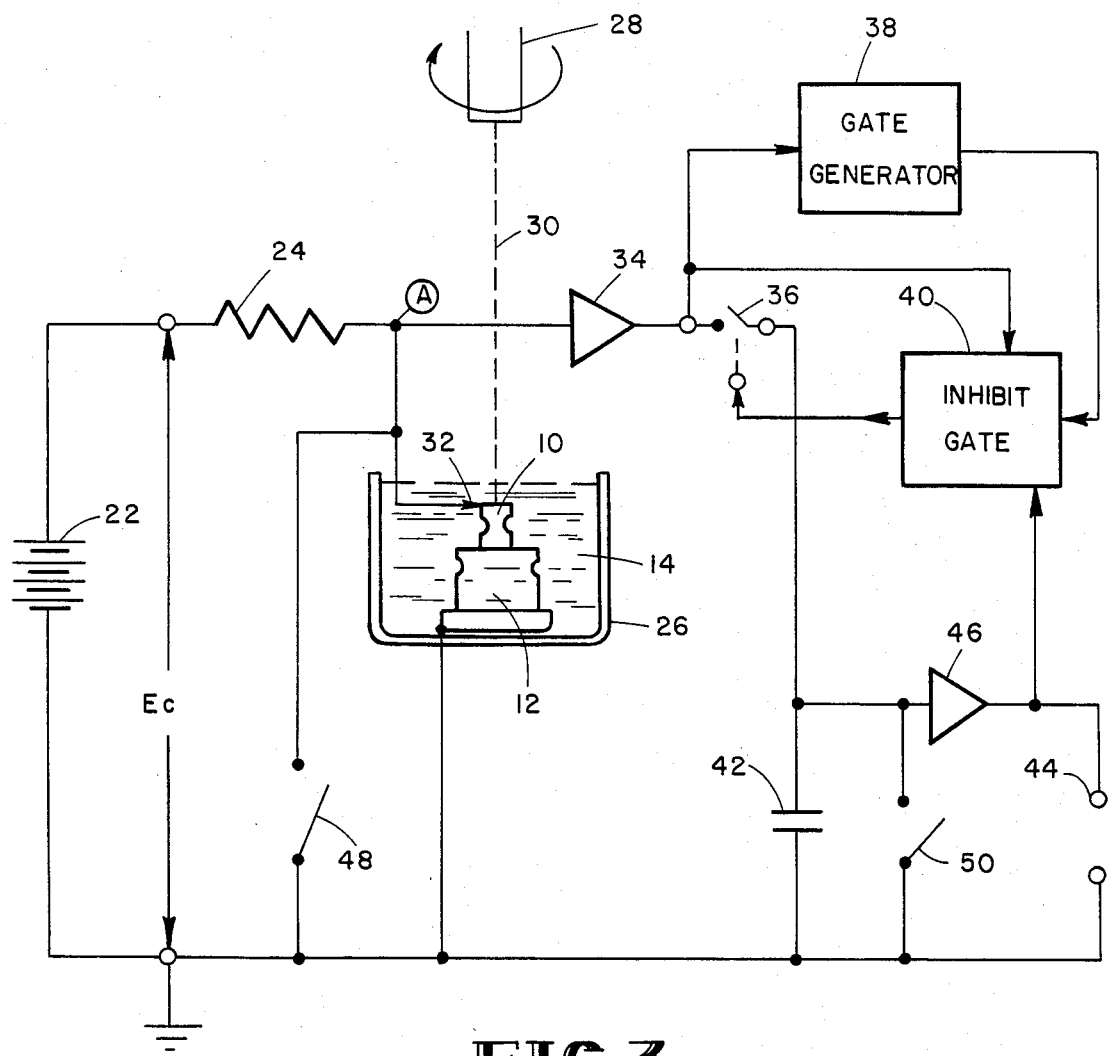
FIG. 3 is an illustrative block diagram of the circuit necessary to measure capacitance and determine clearance between a piston and bore having only momentary and random periods between shorts.
Figure 4:
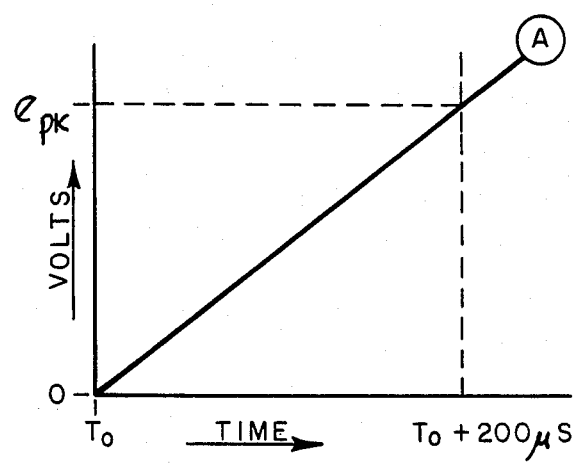
FIG. 4 is a plot of the charge accumulated between the piston and bore of FIG. 3 during a predetermined time period in which there is no short.

Referring now to FIG. 3, an illustrative block diagram of a circuit that may be utilized to determine the capacitive action for random unpredictable moments during which the piston 10 and bore 12 are not shorted is provided. A stable source of voltage $E_C$ is provided by any convenient means and is illustrated herein by battery 22. Current from the battery 22 is applied through series resistor 24 to the piston 10, which is immersed in a lubricant 14. The lubricant is a dielectric fluid having known characteristics and is contained within container 26. The bore 12 is electrically connected to the opposite side of the battery 22 thereby allowing—al direct current flow between the piston 10 and the bore 12 through the dielectric lubricant 14 during periods of nonelectrical short.

A rotating shaft 28 turns the piston 10 by means of an insulating coupling 30 so that the piston 10 is rotated inside of the bore 12. The rotation of the piston 10 may be provided by any convenient means, including rotation by hand, if sufficient insulation is provided. A sliding electrical connector 32 provides continual electrical contact with piston 10 during rotation. As piston 10 is rotated inside of bore 12, the two components are normally an electrical contact, but they may open for brief periods of time on the order of ½ millisecond (0.0005 seconds). Each time the electrical short between the piston 10 and bore 12 is interrupted, they begin to act as plates of a capacitor of known physical dimensions separated by a dielectric of known permittivity or dielectric constant. At the instant the piston 10 and bore 12 begin functioning as a normal capacitor, the capacitor begins charging at a rate that is dependent upon the value of the resistor 24 and the charging voltage $E_C$ provided by battery 22.

The electrical charge between the piston 10 and bore 12 during periods of nonshort appears at point A of FIG. 3. The voltage at point A remains essentially at ground potential during all times when the piston 10 and bore 12 are shorted. However, at the instant the short is removed, the voltage with respect to ground begins to rise at point A. The voltage at point A is communicated unchanged through isolation amplifier 34 to (1) electronic switch 36 which is at that moment open or in the nonconducting state, (2) to the gate generator 38, and (3) to the inhibit gate 40. The gate generator 38 senses the initial rise in capacitor charge voltage at point A to begin a timed gate pulse of typically 200 microseconds duration. However, the timed gate pulse duration may have other values with 100 microseconds being found to be equally acceptable. The gate pulse causes inhibit gate 40 to place the electronic switch 36 in a conducting state by sending a control signal to the electronic switch 36.

If piston 10 and bore 12 continue to function as a capacitor during the timed gate pulse, namely 200 microseconds, a peak charge voltage occurs at A at the end of the 200 microsecond time interval. The peak charge voltage at A is communicated through conducting electronic switch 36 to charge or storage capacitor 42. In those cases, when (1) the piston 10 and bore 12 do not remain unshorted and act as a capacitor for the entire 200 microseconds, or (2) the peak charge voltage stored in charge capacitor 42 is not exceeded, electronic switch 36 remains open and the event is ignored. The event is ignored because the inhibit gate 40 constantly compares the charge voltage at point A via isolation amplifier 34 with the voltage at output terminal 44 as received through isolation amplifier 46.

The inhibit gate 40 inhibits actuation of the electronic switch 36 during periods of nonshort unless the charge voltage at A is greater than the output voltage at output terminal 44. After one or more cycles of piston 10 and bore 12 shorting and unshorting as described hereinabove, storage capacitor 42 will have a stored charge voltage essentially equal to the peak voltage that will appear at point A at the end of the gate pulse received from gate generator 38. The stored peak voltage held in charge capacitor 42 is communicated through isolation amplifier 46 to the output terminal 44.

A chopper switch 48 is provided for those very rare cases where the piston 10 and bore 12 do not intermittently short upon being rotated relative to each other. Chopper switch 48 produces the same effect as a short between piston 10 and bore 12 to allow a measurement to be made on those few assemblies which do not have intermittent internal shorts. Switch 50 provides a reset for the system by discharging charge capacitor 42 to eliminate the charge stored therein prior to another measurement.

In the preferred embodiment as explained in connection with FIG. 3, a series resistor 24 and battery 22 are used for illustration purposes only. Any constant current source of other method of controlling the charge voltage as known by those skilled in the art may be used. Likewise, other features of the present invention are by way of illustration only with each of the component parts being well-known to those skilled in the art.

In summary, each time the electrical short between the piston 10 and bore 12 is interrupted, the piston 10 and bore 12 begin to act as the plates of a capacitor of known physical dimensions separated by a dielectric of known permittivity. The electrical charge between the piston 10 and bore 12 that appears at point A on FIG. 3 gives a transitory capacity value with an electrical signal proportionate thereto being stored in charge capacitor 42. The circuitry senses and reacts to the random and unpredictable moment that the piston 10 and bore 12 unshort and begin to act as a capacitor. At that instant, gate generator 38 initiates a timing interval of typically 200 microseconds. If the piston 10 and bore 12 remain unshorted for the complete timing interval, the peak value of the charge reflected at point A is stored in charging capacitor 42 and read out. If the piston 10 and bore 12 do not remain unshorted for the complete timing interval, the event is ignored. The peak charging voltage used in conjunction with known circuit constants is readily converted by those skilled in the art into equivalent capacitance value and the corresponding average clearance may be calculated therefrom.

Also, if the piston 10 and bore 12 do not remain unshorted for the fixed timing interval, the charge remains in charge capacitor 42. Thereafter, if the voltage at output terminal 44 does not equal the voltage at point A based on the comparison by inhibit gate 40, inhibit gate 40 will keep electronic switch 36 open to prevent further charge on charging capacitor 42. Additional charge is only added to the charging capacitor 42 if the charge at point A during the predetermined timing interval exceeds a preceding charge which would be of shorter duration.

While the invention means and method for electric capacity measurement of erratically shorted capacitors has been described in connection with the preferred embodiment, it is not intended to limit the invention to the particular form set forth, but on the contrary, it is intended to cover such alternatives, modifications, and equivalents as may be included within the spirit and scope of the invention as defined by the appended claims.

I claim:

1. Apparatus for determining the average clearance between concentric cylindrical components having an inner cylindrical component and an outer cylindrical component, comprising:

a dielectric fluid of known permittivity interposed between said inner and outer cylindrical components to permit storage of electrical charge therein;

means for moving said inner cylindrical component with respect to said outer cylindrical component to intermittently interrupt electrical contact between said inner and outer cylindrical components;

means for applying a voltage between said inner cylindrical component and said outer cylindrical component, said means for applying said voltage causing a charging current of known magnitude to flow into a capacitor formed by said dielectric fluid when said electrical contact between said inner and outer cylindrical components is interrupted;

means for communicating magnitude of charge voltage to voltage storage means when said electrical contact between said inner and outer cylindrical components is interrupted, said magnitude of said charge voltage stored in said voltage storage means thereby achieving a peak charge voltage magnitude if said interruption of said electrical contact between said inner and outer cylindrical components is of a predetermined duration; and means for converting said peak charge voltage magnitude into average clearance between said inner and outer cylindrical components.

2. Apparatus for determining the average clearance between concentric cylindrical components, as recited in claim 1, wherein said means for moving said inner cylindrical component comprises a rotatable shaft connected to said inner cylindrical component by means of an insulating coupling.

3. Apparatus for determining the average clearance between concentric cylindrical components, as recited in claim 2, further comprising means for providing a continual electrical contact between said means for applying said voltage and said inner cylindrical component as said inner cylindrical component is rotated within said outer cylindrical component.

4. Apparatus for determining the average clearance between concentric cylindrical components, as recited in claim 3, wherein said means for applying said voltage is a battery with a series resistance of known impedance having a first battery terminal in electrical contact with said inner cylindrical component and a second battery terminal in electrical contact with said outer cylindrical component.

5. Apparatus for determining the average clearance between concentric cylindrical components, as recited in claim 3, wherein said means for applying said voltage is a constant current source.

6. Apparatus for determining the average clearance between concentric cylindrical components, as recited in claim 1, wherein said means for communicating said charge voltage magnitude to said voltage storage means comprises:

means for sensing initial charging of said dielectric fluid to emit a timed gate pulse of said predetermined duration in response thereto;

means for continually comparing said magnitude of said charge voltage to said peak charge voltage magnitude, said comparing means generating a control signal if said magnitude of said charge voltage is less than said peak charge voltage magnitude, said control signal terminating at the end of said timed gate pulse or upon interruption of said charge voltage; and switching means operated by said control signal to increase said peak charge voltage magnitude in said voltage storage means upon generation of said control signal by allowing current flow through said switching means.

7. Apparatus for determining the average clearance between concentric cylindrical components, as recited in claim 6, wherein said means for sensing said charging of said inner and outer cylindrical components comprises a gate generator, said means for comparing comprising an inhibit gate receiving said timed gate pulse from said gate generator, said inhibit gate comparing said peak charge voltage magnitude to said magnitude of said charge voltage during said timed gate pulse to generate said control signal.

8. Apparatus for determining the average clearance between concentric cylindrical components, as recited in claim 7, further comprising an isolation amplifier intermediate said inner cylindrical component and said gate generator.

9. Apparatus for determining the average clearance between concentric cylindrical components, as recited in claim 1, further comprising a means for discharging said voltage storage means.

10. Apparatus for determining the average clearance between concentric cylindrical components, as recited in claim 1, further comprising switch means, said switch means capable of achieving the same effect as said electrical contact between said inner and outer cylindrical components.

11. A method for determining the average clearance between concentric cylindrical components having an inner cylindrical component and an outer cylindrical component includes the steps of:

placing said inner cylindrical component into said outer cylindrical component, said inner and outer cylindrical components having a close contiguous relationship;

inserting between said inner cylindrical component and said outer cylindrical component a dielectric fluid of known permittivity;

applying a known current between said inner cylindrical component and said outer cylindrical component;

moving said inner cylindrical component with respect to said outer cylindrical component to permit intermittent interruption of electrical contact between said inner and outer cylindrical components and thereby permitting voltage charging between said inner cylindrical component and said outer cylindrical component;

communicating said voltage charge magnitude to a voltage storage means;

storing of said voltage charge magnitude in said voltage storage means being stopped upon either (1) reestablishing said electrical contact, or (2) passage of a predetermined time interval;

repeating said preceding steps to achieve a peak charge voltage magnitude by comparing each voltage charge magnitude with said magnitude in said voltage storage means; and calculating said average clearance from said peak charge voltage magnitude.

12. A method for determining the average clearance between concentric cylindrical components, as recited in claim 11, wherein said step of moving said inner cylindrical component includes connecting an insulating coupling to said inner cylindrical component and a rotatable shaft and rotating said rotatable shaft.

13. A method for determining the average clearance between concentric cylindrical components, as recited in claim 11, wherein the step of inserting a dielectric fluid between said inner cylindrical component and said outer cylindrical component includes filling a container with said dielectric fluid and inserting said inner cylindrical component and said outer cylindrical component into said container.

14. A method for determining the average clearance between concentric cylindrical components, as recited in claim 11, wherein said step of communicating said voltage charge magnitude to a voltage storage means includes sensing initial charging between said inner and outer cylindrical components; emitting a timed gate pulse of predetermined duration in response to said initial charging; generating a control signal if said voltage charge magnitude is less than said magnitude in said voltage storage means, said control signal terminating at the end of said timed gate pulse or upon interruption of said charge; and increasing said peak charge voltage magnitude in said voltage storage means upon generation of said control signal.

15. A method for determining the average clearance between concentric cylindrical components, as recited in claim 14, wherein the step of increasing said peak charge voltage magnitude in said voltage storage means includes allowing current flow through switching means, said switching means operated by said control signal.

* * * * *